United States Patent
Perry et al.

(10) Patent No.: US 7,216,330 B1
(45) Date of Patent: May 8, 2007

(54) METHOD AND APPARATUS FOR EXTENDING THE CAPABILITIES OF TOOLS USED FOR DESIGNING SYSTEMS ON PROGRAMMABLE LOGIC DEVICES BY REGISTERING A USER SPECIFIED PROCEDURE

(75) Inventors: Steven Perry, High Wycombe (GB); Gregor Nixon, Bicester (GB); Alasdair Scott, High Wycombe (GB); Philippe Marti, High Wycombe (GB)

(73) Assignee: Altera Corporation, San Jose, CA (US)

( * ) Notice: Subject to any disclaimer, the term of this patent is extended or adjusted under 35 U.S.C. 154(b) by 371 days.

(21) Appl. No.: 10/413,081

(22) Filed: Apr. 14, 2003

(51) Int. Cl.
*G06F 17/50* (2006.01)

(52) U.S. Cl. ............................. 716/18; 716/2; 716/11; 716/17

(58) Field of Classification Search ............... 716/2, 716/16–18, 11, 4
See application file for complete search history.

(56) References Cited

U.S. PATENT DOCUMENTS

| | | | |
|---|---|---|---|
| 6,195,788 B1 * | 2/2001 | Leaver et al. | 716/18 |
| 6,298,319 B1 * | 10/2001 | Heile et al. | 716/17 |
| 6,321,369 B1 * | 11/2001 | Heile et al. | 716/11 |
| 6,496,972 B1 * | 12/2002 | Segal | 716/18 |
| 6,779,169 B1 * | 8/2004 | Singh et al. | 716/16 |
| 6,823,497 B2 * | 11/2004 | Schubert et al. | 716/4 |
| 2004/0128641 A1 * | 7/2004 | Broberg et al. | 716/18 |

* cited by examiner

*Primary Examiner*—Thuan Do
(74) *Attorney, Agent, or Firm*—L. Cho

(57) ABSTRACT

A method for designing a system on a PLD is disclosed according to a first embodiment of the present invention. A logic design is optimized. Logic circuits from the logic design are mapped to resources on the PLD. At least some of the resources are fitted onto locations on the PLD by utilizing a user-specified procedure.

25 Claims, 6 Drawing Sheets

METHOD AND APPARATUS FOR EXTENDING THE CAPABILITIES OF TOOLS USED FOR DESIGNING SYSTEMS ON PROGRAMMABLE LOGIC DEVICES BY REGISTERING A USER SPECIFIED PROCEDURE

FIELD OF THE INVENTION

The present invention relates to the field of programmable logic devices (PLDs). More specifically, the present invention relates to a method and apparatus for extending the capabilities of tools used for designing systems on PLDs such as electronic design automation (EDA) tools.

BACKGROUND

PLDs may be used to implement large systems that include millions of gates and megabits of embedded memory. The complexity of large systems often require the use of EDA tools to manage and optimize their design onto physical target devices. Of the tasks required in managing and optimizing design, satisfying timing and placement constraints of a system is often the most important and the most challenging. In order to satisfy timing and placement constraints, several iterations are often required to determine how components in logic blocks are to be grouped and where these logic blocks are placed on the target device.

Automated placement algorithms in EDA tools perform the time-consuming task of managing and optimizing designs onto physical devices. However, in some occasions, standard automated placement algorithms found in off the shelf EDA tools are incapable of finding solutions that specialized placement algorithms can find. In addition, some designs may require additional placement modifications to be provided. Modifications to placement techniques are often necessary to identify and address fitting issues that automated algorithms are slow to or even sometimes unable to identify. Current EDA tools, however, require that placement modifications be provided after a compilation process by the EDA tools and that the compilation process be run again thereafter. Compilation processes may require hours of time before completion. When multiple iterations are required to find a solution, this translates into several hours of waiting time.

Thus, what is needed is a method and apparatus for extending the capabilities of tools used for designing systems on PLDs. This improved method and apparatus should provide the user with more flexibility in the design process while reducing wait time in the compilation process.

SUMMARY

A method and apparatus for extending the capabilities of tools used for designing systems on PLDs is disclosed according to an embodiment of the present invention. An interface is provided that allows a user to augment or substitute standard procedures used by the tools in order to customize the tools for use for a specific system design with a user-specified procedure. User-specified procedures may be used, for example, to better support engineering change orders, layout modifications, and satisfaction of timing constraints.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

Figure 1:
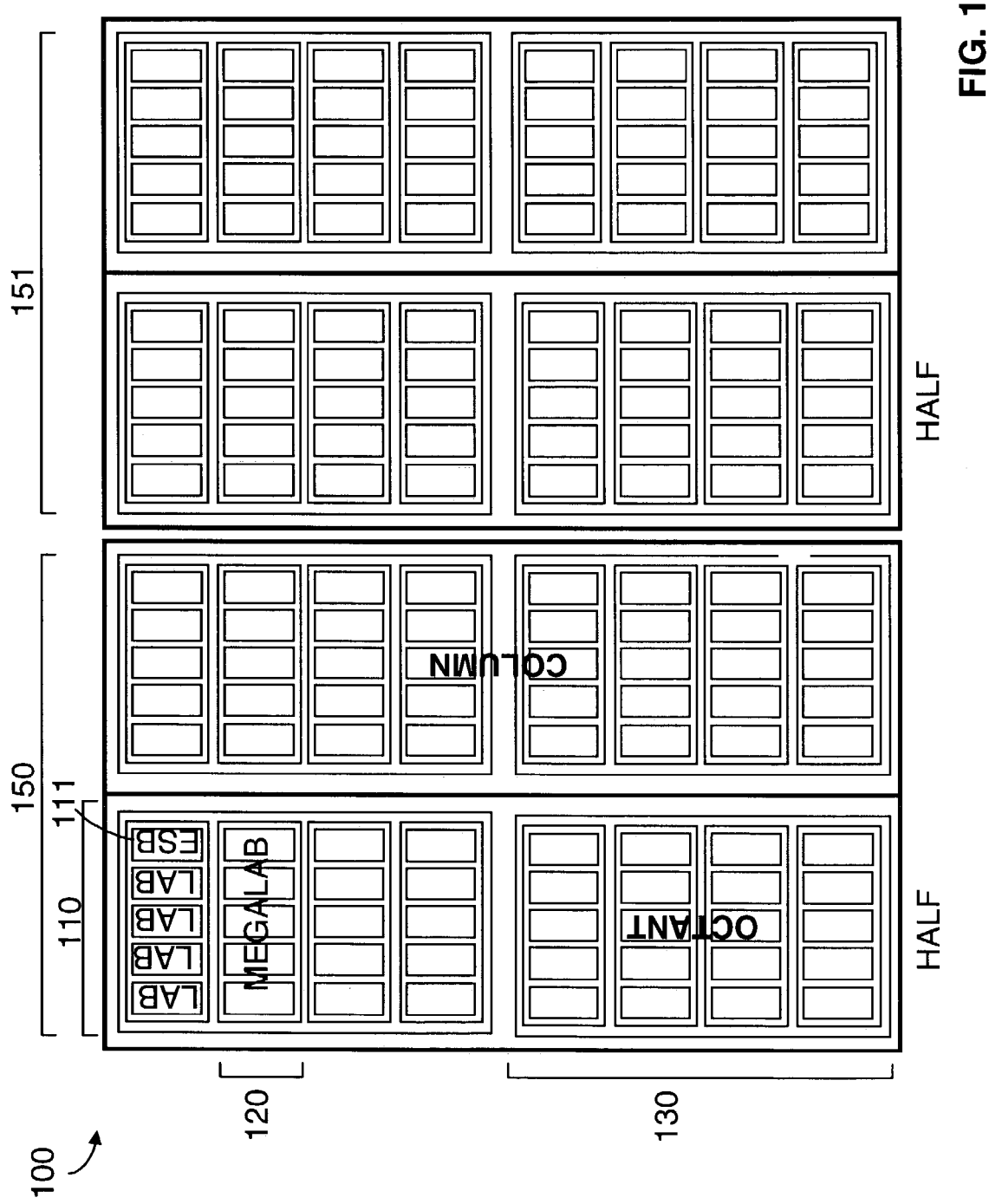
FIG. 1 illustrates a target device utilizing programmable logic devices (PLDs) according to an embodiment of the present invention.

FIG. 1 illustrates an exemplary target device 100 utilizing PLDs according to an embodiment of the present invention. The present invention may be used to design a system onto the target device 100. According to one embodiment, the target device 100 is a chip having a hierarchical structure that may take advantage of wiring locality properties of circuits formed therein. The lowest level of the hierarchy is a logic element (LE) (not shown). According to one embodiment of the target device 100, the LE may include a 4-input lookup table with a configurable flip-flop. Groups of 10 LEs form a logic-array block (LAB). A first group of LABs is shown as 110. LEs in a LAB are able to communicate with other LEs via LAB local interconnect lines (not shown).

Groups of 16 LABs and 1 embedded system block (ESB) 111 form a MegaLab. A first MegaLab is shown as 120. ESBs may be used to implement memory circuitry such as random access memories (RAMs), read only memories (ROMs), content addressable memories (CAMs), and other types of memory circuitry. Each LAB in a MegaLab is able to communicate with its adjacent neighboring LABs via the LAB local interconnect lines. Alternatively, communication may be sent via a MegaLab interconnect (not shown), which includes a set of continuous metal lines that span the width of the MegaLab. LEs within any LAB can directly drive the MegaLab interconnect. The signal then traverses the metal line to a local input line associated with the destination LAB, and then to any dependent LE.

Groups of 13 MegaLabs form an Octant. A first Octant is shown as 130. Each MegaLab in an Octant is able to communicate with other MegaLabs via a series of continuous vertical interconnect lines (V-lines) (not shown). Signals communicating across an Octant start from a source LE that directly drives a V-line. The signals traverse to the target MegaLab, switch onto the MegaLab interconnect, and make their way to the destination LE.

Two Octants are stacked vertically to form a Column. A first Column is shown as 140. Communication between Octants is made possible by a buffered switch (not shown) that connects the V-lines between two Octants together.

Groups of two Columns form a Half. A first Half is shown as 150 and a second Half is shown as 151. Continuous horizontal interconnect lines (H-lines) run across the width of the two Columns. Signals that traverse across the Half start at the source LE which can directly drive the H-line. From the H-line, the signal can drive an appropriate V-line in the target Octant and traverse its way to the destination LEs using the intra-Octant communication scheme. Two Halves are grouped side by side to form a Chip. The two Halves are connected to the buffered switch which may be used for communication between Halves.

Each level of the hierarchy described has delay characteristics. As communication is transmitted out of each level of hierarchy, a delay is incurred. As communication is transmitted to a next higher level of hierarchy, a larger delay is incurred. FIG. 1 illustrates an exemplary embodiment of a target device. It should be appreciated that a target device may include a plurality of Chips, such as target device 100 cascaded together. A target device may include programmable logic devices arranged in a manner different than that on the target device 100. A target device may also include components other than those described in reference to the target device 100. Thus, while the invention described herein may be utilized on the architecture described in FIG. 1, it should be appreciated that it may also be utilized on different architectures, such as those employed by Altera® Corporation in its Stratix™ family of chips and those employed by Xilinx®, Inc. in its Virtex™ and Virtex™ II line of chips.

Figure 2:
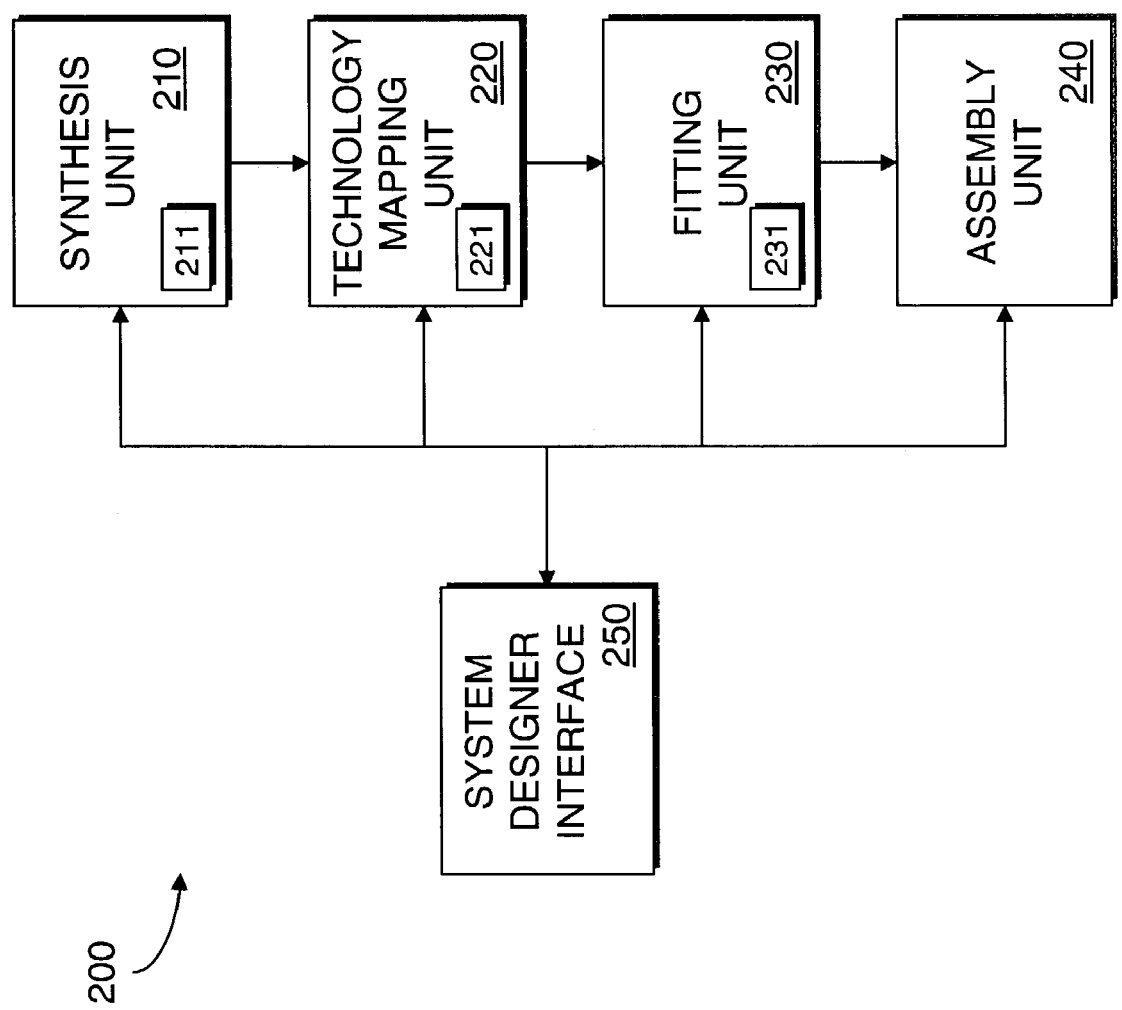
FIG. 2 illustrates a system designer according to an embodiment of the present invention.

FIG. 2 illustrates a system designer 200 according to an embodiment of the present invention. The system designer 200 may be an EDA tool. FIG. 2 illustrates software modules implementing an embodiment of the present invention. According to one embodiment, system design may be performed by a computer system (not shown) executing sequences of instructions represented by the software modules shown in FIG. 2. Execution of the sequences of instructions causes the computer system to support system design as will be described hereafter. In alternate embodiments, hard-wire circuitry may be used in place of or in combination with software instructions to implement the present invention. Thus, the present invention is not limited to any specific combination of hardware circuitry and software.

Block 210 represents a synthesis unit. The synthesis unit 210 generates a logic design of a system to be implemented by the target device 100 (shown in FIG. 1). According to an embodiment of the system designer 200, the synthesis unit 210 takes a conceptual Hardware Description Language (HDL) design definition and generates an optimized logical representation of the system. The optimized logical representation of the system generated by the synthesis unit 210 may include a representation that has a minimized number of logic gates and logic elements required for the system. Alternatively, the optimized logical representation of the system generated by the synthesis unit 210 may include a representation that has a reduced depth of logic and that generates a lower signal propagation delay.

Block 220 represents a technology mapping unit 220. The technology mapping unit 220 determines how to implement the logic gates and logic elements in the optimized logic representation utilizing specific resources on the target device 100. According to an embodiment of the system designer 200, the technology mapping unit 220 generates a netlist. The netlist illustrates how the resources on the target device 100 are utilized to implement the system. The netlist may, for example, represent components such as LEs on the target device 100. The netlist may also represent the interconnect lines between the components.

Block 230 represents a fitting unit 230. The fitting unit 230 fits the system on the target device 100 by determining which resources on the target device 100 to be used for specific logic gates, logic elements, and connections between the logic gates and elements. According to an embodiment of the system designer 200, the fitting unit 230 first determines how to implement portions of the optimized logic design in clusters. Clusters may represent a subset of the components on the target device 100 such as, for example, a LAB having 10 LEs. In this embodiment, after portions of the optimized logic design are implemented in clusters, the clusters may be placed by assigning the clusters to specific LABs on the target device 100. Following the placement of the clusters, routing interconnections between the LEs may be performed. The fitting unit 230 may utilize a cost function in order to determine an optimal assignment of resources on the target device 100.

Block 240 represents an assembler unit 240. The assembler unit 240 creates a data file that includes the information generated by the fitting unit 230. The data file may be a bit stream that may be used to program the target device 100. When a system design is processed by the synthesis unit 210, mapping unit 220, fitting unit 230, and assembly unit 240, this is referred to as a compilation.

Block 250 represents a system designer interface. The system designer interface 250 allows a user to interact with the modules of the system designer 200. A user may use a command supported by the system designer interface 250 to register a user-specified procedure or function that is to be executed or called back in place of or in addition to an operation performed by one of the modules of the system designer 200. The user-specified procedure may be, for example, a user-written procedure. The procedure may, for example, call script commands that utilize procedures, functions, or programs from the system designer 200 or other resources. Call-backs may be inserted by the user at strategic points available in the system designer 200. The user-specified procedures called may operate as extensions to the system designer 200. According to an embodiment of the system designer 200, the system designer interface 250 includes an script interpreter and/or library (not shown). The system designer interface 250 may, for example, utilize a Tool Command Language (TCL) interpreter and/or library. In this embodiment, the extensions may be implemented by TCL scripts. It should be appreciated, that the system designer interface 200 may implement other interpreted programming language interpreters and/or libraries and that the extensions may be implemented utilizing other scripts or programs. According to an embodiment of the system designer 200, the system designer interface 250 includes a function that registers call-backs to procedures, records script commands and a point where they should be called.

According to an embodiment of the system designer 200, the synthesis unit 210, mapping unit 220, and fitting unit 230 each includes an interface. The synthesis unit 210, mapping unit 220, and fitting unit 230 include interfaces 211, 221, and 231 respectively. Each interface registers script commands with the script interpreter in the system design interface 250. This allows the script commands to be called by a registered user-specified procedure. It should be appreciated that the synthesis unit 210, mapping unit 220, fitting unit 230, assembly unit 240, and system design interface 250 may be implemented using any known circuitry or technique. It should also be appreciated that not all the components shown in FIG. 2 may be required to implement the system designer 200.

Figure 3:
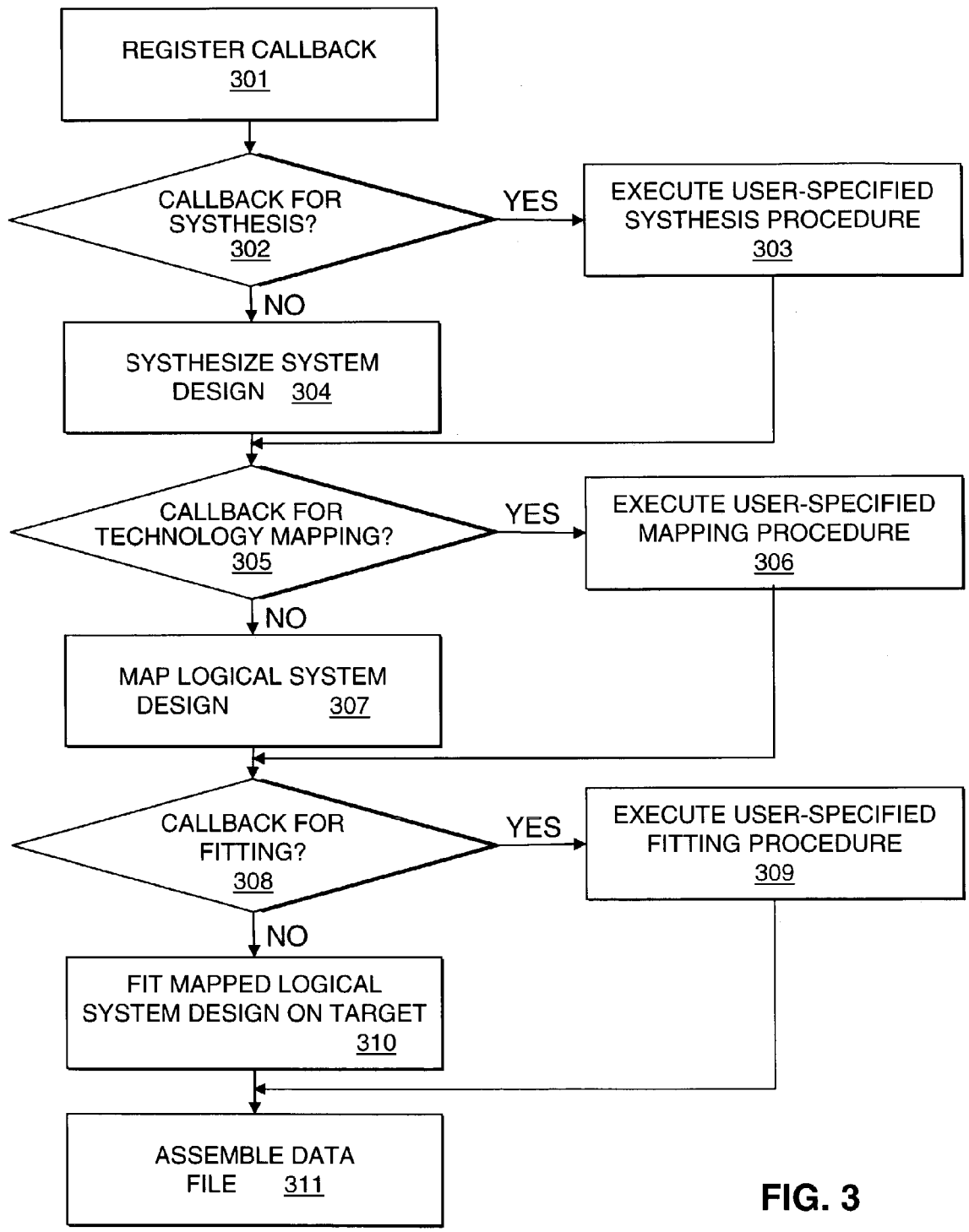
FIG. 3 is a flow chart illustrating a method for designing a system on a PLD according to an embodiment of the present invention.

FIG. 3 is a flow chart illustrating a method for designing a system on a PLD according to an embodiment of the present invention. At 301, a user is given an opportunity to register user-specified procedures to be called back or executed in a program. According to an embodiment of the present invention, the name and arguments of the user-specified procedure and the point of the program where the user-specified procedure is to be called back is recorded in a registry. In one embodiment, the user may specify any command string. This may be a call to a user written procedure that may optionally take arguments.

At 302, it is determined whether a user-specified synthesis procedure is registered for a synthesis procedure. The user-specified synthesis procedure may be registered to be executed, for example, before or after execution of the synthesis procedure has begun or in place of the synthesis procedure. According to an embodiment of the present invention, the determination of whether a user-specified synthesis procedure is registered is achieved by checking the registry. If a user-specified synthesis procedure is registered for the synthesis procedure, control proceeds to 303. If a user-specified synthesis procedure is not registered for the synthesis procedure, control proceeds to 304.

At 303, control executes the user-specified synthesis procedure. The user-specified synthesis procedure may be used to augment or replace a standard synthesis procedure of the program. Control proceeds to 305.

At 304, a synthesis procedure is performed on the system. The synthesis procedure involves generating a logic design of the system to be implemented by a target device. According to an embodiment of the present invention, the synthesis procedure generates an optimized logical representation of the system from a HDL design definition.

At 305, it is determined whether a user-specified technology mapping procedure is registered for a technology mapping procedure. The user-specified technology mapping procedure may be registered to be executed, for example, before or after execution of the technology mapping procedure has begun or in place of the technology mapping procedure. According to an embodiment of the present invention, the determination of whether a user-specified technology mapping procedure is registered is achieved by checking the registry. If a user-specified technology mapping procedure is registered for the technology mapping procedure, control proceeds to 306. If a user-specified technology mapping procedure is not registered for the technology mapping procedure, control proceeds to 307.

At 306, control executes the user-specified technology mapping procedure. The user-specified technology mapping procedure may be used to augment or replace a standard technology mapping procedure of the program. Control proceeds to 308.

At 307, a technology mapping procedure is performed on the optimized logical design of the system. The technology mapping procedure involves determining how to implement logic gates and logic elements in the optimized logic representation with specific resources on the target device. According to an embodiment of the present invention, the technology mapping procedure generates a netlist.

At 308, it is determined whether a user-specified fitting procedure is registered for a fitting procedure. The user-specified fitting procedure may be registered to be executed, for example, before or after execution of the fitting procedure has begun or in place of the fitting procedure. According to an embodiment of the present invention, the determination of whether a user-specified fitting procedure is registered is achieved by checking the registry. If a user-specified fitting procedure is registered for the fitting procedure, control proceeds to 309. If a user-specified fitting procedure is not registered for the fitting procedure, control proceeds to 310.

At 309, control executes the user-specified fitting procedure. The user-specified fitting procedure may be used to augment or replace a standard fitting procedure of the program. Control proceeds to 311.

At 310, a fitting procedure is performed on the mapped logical system design. The fitting procedure fits the system on the target device by determining which resources on the target device is to be used for specific logic gates, logic elements, and connections between the logic gates and elements. According to an embodiment of the present invention, the fitting procedure includes pre-processing, clustering, placing, and routing.

At 311, an assembly procedure is performed. The assembly procedure involves creating a data file that includes information determined by the fitting procedure. The data file may be a bit stream that may be used to program the target device.

It should be appreciated that the user-specified procedures 303, 306, and 309 may include the standard procedures 304, 307, and 310 such that the user-specified procedures 303, 306, and 309 may be executed in place of or in addition to the standard procedures 304, 307, and 310. For example, an extension in a user-specified procedure may be executed before, or after a standard procedure has begun execution.

According to an embodiment of the present invention, the system designer 200 (shown in FIG. 2) uses one instance of the interpreter in the system designer interface 250 (shown in FIG. 2). This allows a script that is run at one of the user-specified procedures (303, 306, or 309) to store data that can later be accessed by a different script that may be run later in the compilation. The system designer interface 260 (shown in FIG. 2) and the fitter unit interface 231 (shown in FIG. 2) allows the operation of the fitter unit 230 (shown in FIG. 2) to be extended by executing a script such as TCL scripts. A user may augment existing fitting algorithms, implement a specialized or domain specific algorithm, or insert late modifications by writing a script.

Figure 4:
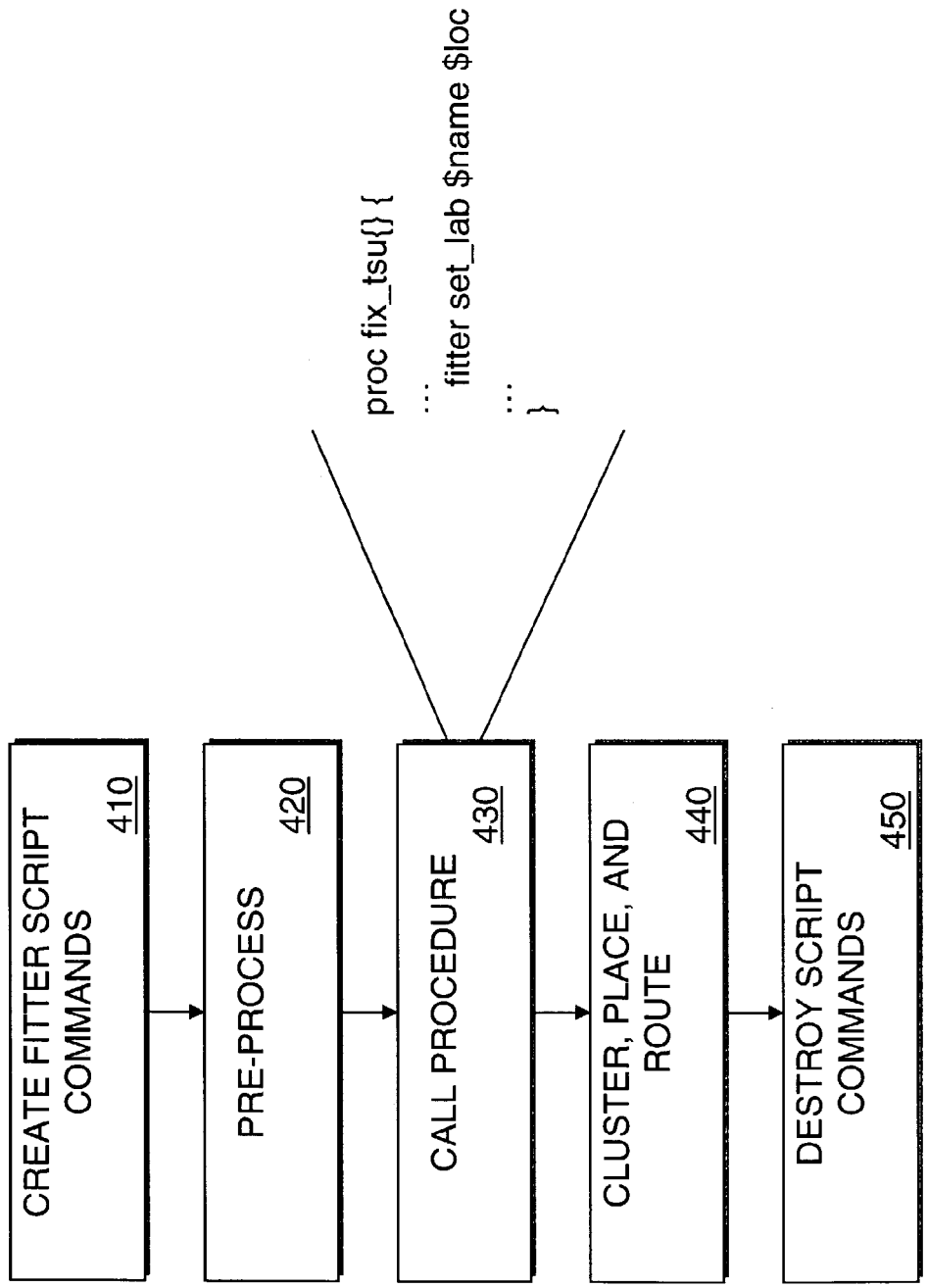
FIG. 4 is a flow chart illustrating an exemplary compilation flow where an extension is added to supplement a fitting procedure according to a first embodiment of the present invention.

FIG. 4 illustrates an exemplary compilation flow where an extension is added to supplement a fitting procedure according to a first embodiment of the present invention. In this example, a user-specified procedure called "fix_tsu" is registered to be executed after pre-processing in the fitter procedure. The fix_tsu procedure may operate to address issues with timing set up in a system. With reference to the flow chart illustrated in FIG. 3, the registration of the user-specified procedure may be performed at 301. The compilation flow shown in FIG. 4 may be performed at 309.

Referring back to FIG. 4, at 410, fitter script commands are created. According to an embodiment of the present invention, the fitter script commands are registered with a script interpreter. When called, the script commands may execute procedures and functions supported by the system designer 200 (shown in FIG. 2) or procedures and functions supported by an external resource. In this embodiment, among other script commands that may be registered with the interpreter, the script command "fitter" is registered. The script command string "fitter set_lab $name $loc" calls the command "fitter" with arguments "set_lab $name $loc", where $name and $loc are variables. This command string allocates a specific LAB to a specific location on the target device 100 (shown in FIG. 1).

At 420, pre-processing is performed. According to an embodiment of the present invention, preprocessing may involve placing specific LEs into LABs, matching registers with pins, or other functions.

At 430, the user-specified procedure is called. In this embodiment, the user-specified procedure fix_tsu is executed. Among the commands that are registered with the script interpreter that are called, the command fitter set_lab $name $loc is called by fix_tsu.

At 440, clustering, placing, and routing of the resources on the target device 100 (shown in FIG. 1) is performed with the additional location information generated by the fix_tsu procedure.

At 450, the script commands registered at 410 are destroyed or unregistered.

Figure 5:
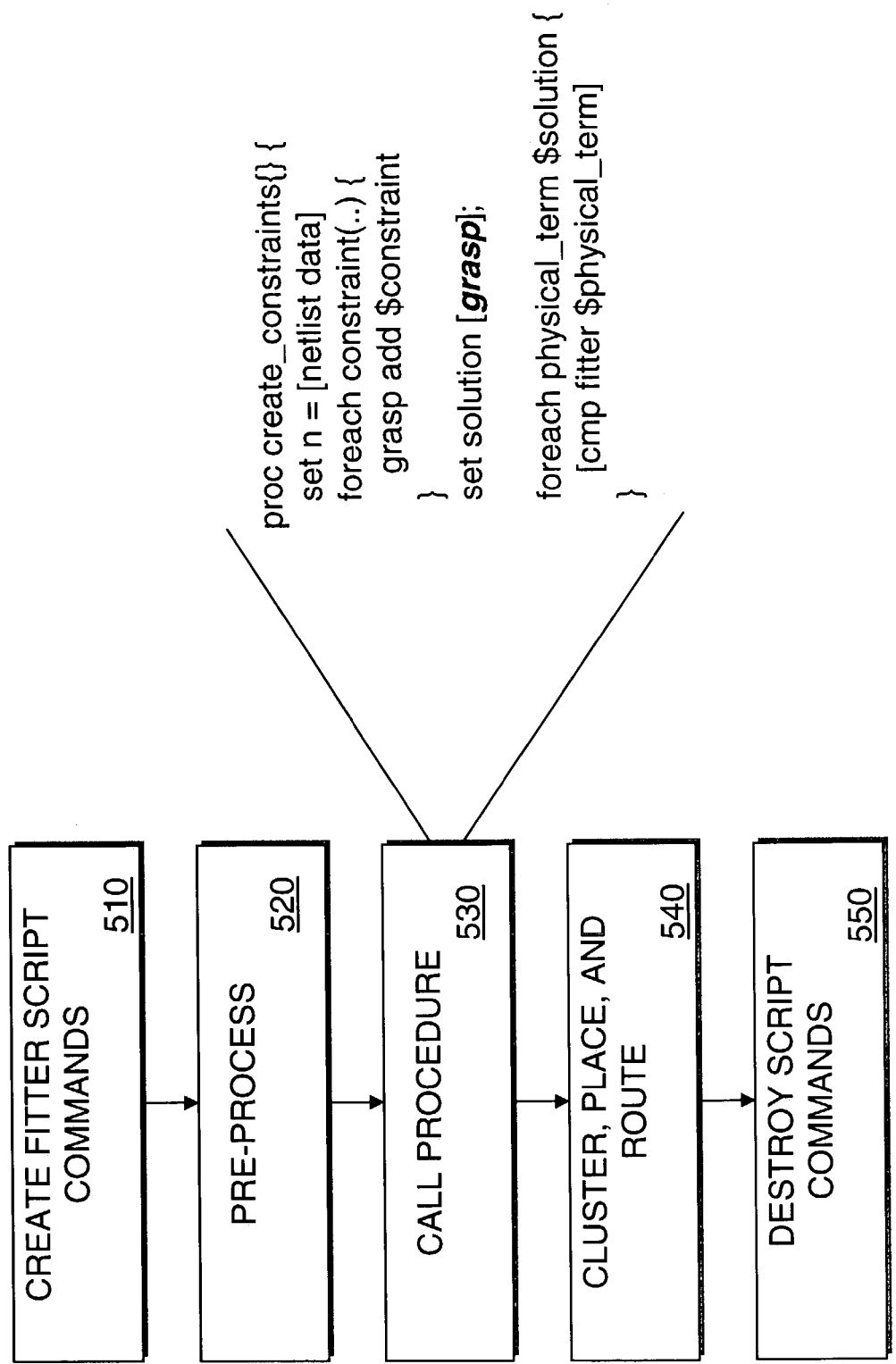
FIG. 5 is a flow chart illustrating an exemplary compilation flow where an extension is added to supplement a fitting procedure according to a second embodiment of the present invention.

FIG. 5 illustrates an exemplary compilation flow where an extension is added to supplement a fitting procedure according to a second embodiment of the present invention. In this example, a user-specified procedure called "create_constraint" is registered to be executed after pre-processing in the fitter procedure. The create_constraint procedure may operate to set up constraints that may be passed to a specialized constraint satisfaction engine external to the system designer 200 (shown in FIG. 2). With reference to the flow chart illustrated in FIG. 3, the registration of the user-specified procedure may be performed at 301. The compilation flow shown in FIG. 5 may be performed at 309.

Referring back to FIG. 5, at 510, fitter script commands are created. According to an embodiment of the present invention, the fitter script commands are registered with a script interpreter. When called, the script commands may execute procedures and functions supported by the system designer 200 (shown in FIG. 2) or procedures and functions supported by an external resource. In this embodiment, among other script commands that may be registered, the script command "fitter add $physical_term" is registered.

In this embodiment, among other script commands that may be registered with the interpreter, the script command "fitter" is registered. The script command string "fitter add $physical_term" calls the command "fitter" with arguments "add $physical_term", where $physical_term are variables. The command string adds a physical constraint to the system to be implemented on the target device 100 (shown in FIG. 1).

At 520, pre-processing is performed. According to an embodiment of the present invention, preprocessing may involve placing specific LEs into LABs, matching registers with pins, or other functions.

At 530, the user-specified procedure is called. In this embodiment, the user-specified procedure create_constraint is executed. This procedure retrieves a number of constraints such as timing constraints from a netlist. The procedure passes these constraints to an external constraint satisfaction engine. The constraint satisfaction engine generates a physical solution to meet these constraints in the form of a physical constraint. The physical constraints are sent back to system designer 200. Among the commands that are registered with the script interpreter that are called, the command fitter add $physical_terms is called by create_constraint.

At 540, clustering, placing, and routing of the resources on the target device 100 is performed with the additional physical constraints generated by the constraint satisfaction engine.

At 550, the script commands registered at 510 are destroyed or unregistered.

By utilizing an extension to interface an external constraint satisfaction engine, additional power may be given to the system designer 200. Specialized constraint satisfaction engines may be a useful tool for checking the legality of a set of constraints. When a set of constraints cannot be satisfied, the system designer 200 may be spared the task of finding a solution. However, if a set of constraints can be satisfied, the constraint satisfaction engine may return a solution or simplified set of constraints that may be processed by the system designer 200.

Figure 6:
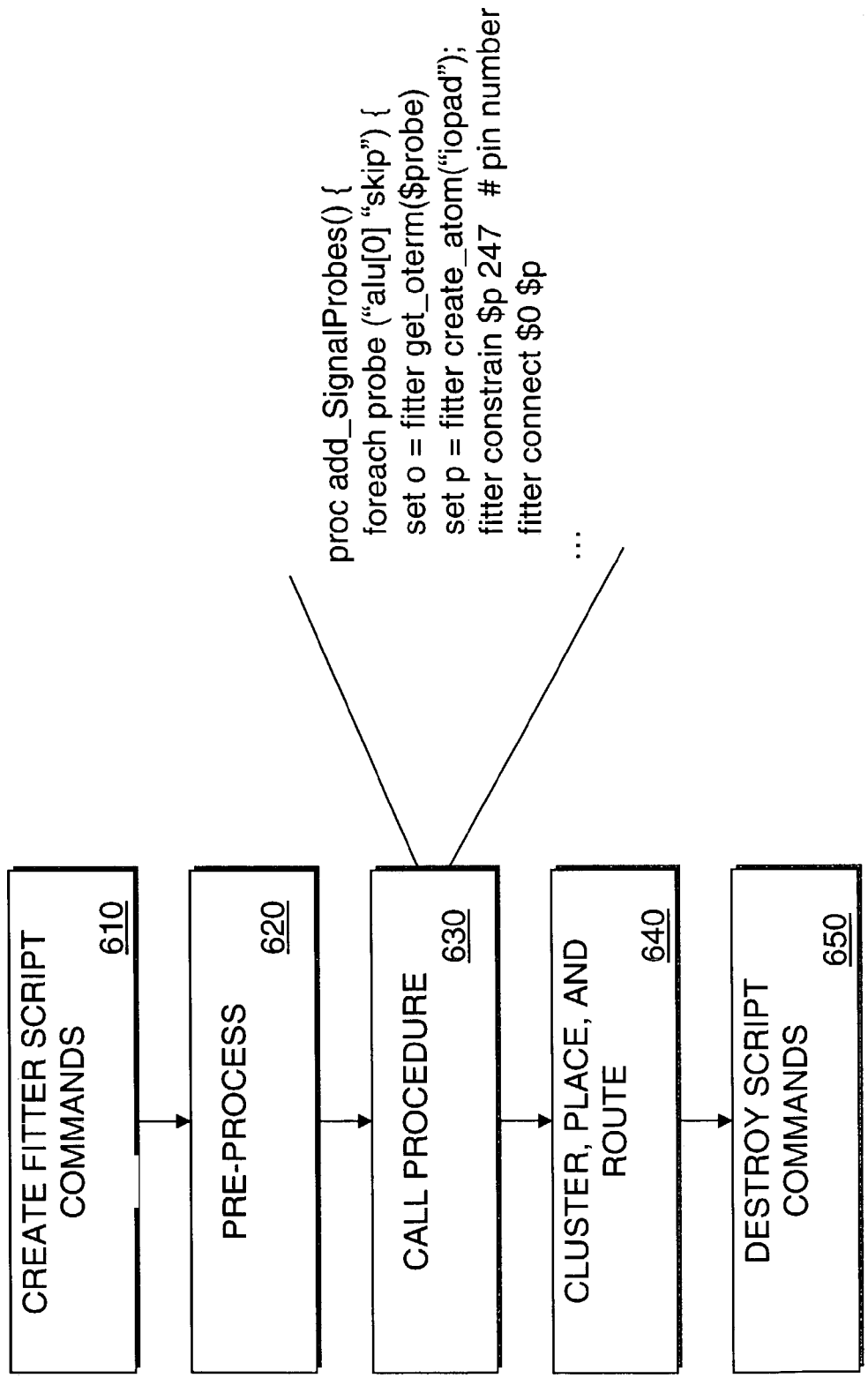
FIG. 6 is a flow chart illustrating an exemplary compilation flow where an extension is added to facilitate trouble shooting of a system design according to an embodiment of the present invention.

FIG. 6 illustrates an exemplary compilation flow where an extension is added to facilitate trouble shooting of a system design according to an embodiment of the present invention. In this example, a user-specified procedure called "add_signal probes" is registered to be executed after pre-processing in the fitter procedure. The add_signal probes procedure may operate to route signals from the system to pins to allow testing of the target device 100 (shown in FIG. 1). With reference to the flow chart illustrated in FIG. 3, the registration of the user-specified procedure may be performed at 301. The compilation flow shown in FIG. 6 may be performed at 309.

Referring back to FIG. 6, at 610, fitter script commands are created. According to an embodiment of the present invention, the fitter script commands are registered with a script interpreter. When called, the script commands may execute procedures and functions supported by the system designer 200 (shown in FIG. 2) or procedures and functions supported by an external resource. In this embodiment, among other script commands that may be registered with the interpreter, the script commands "fitter" is registered. The script command strings "fitter get_oterm", "fitter create_atom", "fitter constrain", and "fitter connect" calls the command "fitter" with arguments "get_oterm", "create_atom", "constrain", and "connect". The script command string "fitter get_oterm" retrieves a specified signal. The script command string "fitter create_atom" creates a pin. The script command string "fitter constrain" allocates a location for a pin on the target device 100. The script command string "fitter connect" routes a connection between the signal to the pin.

At 620, pre-processing is performed. According to an embodiment of the present invention, preprocessing may involve placing specific LEs into LABs, matching registers with pins, or other functions.

At 630, the user-specified procedure is called. In this embodiment, the user-specified procedure add_signalprobes is executed. Among the commands that are registered with the script interpreter that are called, the command fitter get_oterm, fitter create_atom, fitter constrain, and fitter connect are called by add_signalprobes.

At 640, clustering, placing, and routing of the resources on the target device 100 is performed with the additional constraints generated by add_signalprobes.

At 650, the script commands registered at 610 are destroyed or unregistered.

By utilizing an extension to add signal probes, users may debug system designs by routing internal signals out to unused pins. This procedure may be used after a design has been compiled and programmed onto a target device 100 in cases where the target device 100 behavior differs from simulation. The routing required for adding signal probes may be inserted without altering existing routing. The procedure may be used for creating and inserting atoms representing pins or additional logic into the netlist.

With reference to FIGS. 4–6, exemplary script commands are created during the compilation flows. It should be appreciated that other script commands that perform other functionalities may also be created. According to an embodiment of the present invention, a plurality of script commands are created prior to the execution of each user-specified procedure. In an alternate embodiment, when a user-specified procedure replaces an entire standard procedure, the plurality of script commands may be created during the execution of the user-specified procedure. These script commands may be used to access functionalities in the system designer 200 or an external resource. These scripts commands that access the functionality of the system designer 200 are created regardless of whether or not the script commands are called by the user-specified procedure. In one embodiment, commands that access external resources are unknown to the system designer 200 and are created and registered with the interpreter separately.

FIGS. 3–6 are flow charts illustrating a method for designing a system on a PLD and exemplary compilation flows where extensions are added to the system designer 200 (shown in FIG. 2). Some of the techniques illustrated in these figures may be performed sequentially, in parallel or in an order other than that which is described. It should be appreciated that not all of the techniques described are required to be performed, that additional techniques may be added, and that some of the illustrated techniques may be substituted with other techniques.

Embodiments of the present invention (e.g. exemplary process described below with respect to FIGS. 3–6) may be provided as a computer program product, or software, that may include a machine-readable medium having stored thereon instructions. The machine-readable medium may be used to program a computer system or other electronic device. The machine readable medium may include, but is not limited to, floppy diskettes, optical disks, CD-ROMs, and magneto-optical disks, ROMs, RAMs, EPROMs, EEPROMs, magnetic or optical cards, flash memory, or other type of media/machine-readable medium suitable for storing electronic instructions.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for designing a system on a programmable logic device (PLD), comprising:
   registering a user-specified procedure not available on a system designer;
   optimizing a logic design;
   mapping logic circuits from the logic design to resources on the PLD; and
   fitting at least some of the resources onto locations on the PLD by utilizing the user-specified procedure.

2. The method of claim 1, wherein optimizing the logic design comprises minimizing a number of logic circuits in the logic design.

3. The method of claim 1, wherein mapping logic circuits from the logic design to resources on the PLD comprises determining how to utilize the resources of the PLD to implement the logic circuits.

4. The method of claim 1, wherein fitting at least some of the resources onto locations on the PLD utilizing the user-specified procedure comprises executing a script that calls script commands that access an internal function.

5. The method of claim 1, wherein fitting at least some of the resources onto locations on the PLD utilizing the user-specified procedure comprises executing a script that calls script commands that access an external resource.

6. The method of claim 1, wherein fitting at least some of the resources onto locations on the PLD utilizing the user-specified procedure comprises executing a script that calls a constraint satisfaction engine.

7. The method of claim 1, wherein registering the user-specified procedure comprises indicating when the user-specified procedure is to be executed.

8. The method of claim 1, further comprising creating script commands to be utilized by the user-specified procedure.

9. A method for designing a system on a programmable logic device (PLD), comprising:
   registering a user-specified procedure not available on a system designer;
   optimizing a logic design;
   mapping logic circuits in the logic design to resources available on the PLD;
   fitting at least some of the resources available on the PLD onto locations on the PLD; and
   executing the user-specified procedure to support optimizing, mapping or fitting.

10. The method of claim 9, wherein registering the user-specified procedure comprises indicating when the user-specified procedure is to be executed.

11. The method of claim 9, wherein executing the user-specified procedures comprises executing a script that calls script commands that access an internal function.

12. The method of claim 9, wherein executing the user-specified procedures comprises executing a script that calls script commands that access an external resource.

13. The method of claim 9, further comprising creating script commands to be utilized by the user-specified procedure.

14. A machine-readable medium having stored thereon sequences of instructions, the sequences of instructions including instructions which, when executed by a processor, causes the processor to perform:
   registering a user-defined procedure;
   optimizing a logic design;
   mapping logic circuits from the logic design to resources on a programmable logic device (PLD); and
   fitting at least some of the resources onto locations on the PLD by utilizing the user-specified procedure.

15. The machine-readable medium of claim 14, wherein fitting at least some of the resources onto locations on the PLD by utilizing the user-specified procedure comprises executing a script that calls script commands that access an internal function.

16. The machine-readable medium of claim 14, wherein fitting at least some of the resources onto locations on the PLD utilizing the user-specified procedure comprises executing a script that calls script commands that access an external resource.

17. The machine-readable medium of claim 14, wherein fitting at least some of the resources onto locations on the PLD utilizing the user-specified procedure comprises executing a script that calls a constraint satisfaction engine.

18. A machine-readable medium having stored thereon sequences of instructions, the sequences of instructions including instructions which, when executed by a processor, causes the processor to perform:

registering a user-specified procedure;
optimizing a logic design;
mapping logic circuits in the logic design to resources available on a programmable logic device (PLD);
fitting at least some of the resources available on the PLD onto locations on the PLD; and
executing the user-specified procedure to support optimizing, mapping or fitting.

19. The machine-readable medium of claim 18, wherein registering the user-specified procedure comprises indicating when the user-specified procedure is to be executed.

20. The machine-readable medium of claim 18, wherein executing the user-specified procedures comprises executing a script that calls script commands that access an internal function.

21. The machine-readable medium of claim 18, wherein executing the user-specified procedures comprises executing a script that calls script commands that access an external resource.

22. A system designer for programmable logic devices (PLDs), comprising:

a synthesis unit that optimizes a logic design;
a technology mapping unit that maps logic circuits from the logic design onto resources available on a PLD;
a fitter unit that allocates locations on the PLD for at least some of the resources; and
a system designer interface that allows a user to register user-specified procedures not available on the system designer to support components of the system designer.

23. The system designer of claim 22, wherein the user-specified procedures comprises a script that calls script commands that access a function internal to the system designer.

24. The system designer of claim 22, wherein the user-specified procedure comprises a script that calls script commands that access a resource external to the system designer.

25. The system designer of claim 22, wherein to register the user-specified procedures comprises indicating when the user-specified procedures are to be executed.

* * * * *